(12) United States Patent
Fukakusa et al.

(10) Patent No.: US 10,722,964 B2
(45) Date of Patent: Jul. 28, 2020

(54) VISCOUS FLUID SUPPLY DEVICE

(71) Applicant: FUJI CORPORATION, Chiryu-shi (JP)

(72) Inventors: Shoji Fukakusa, Yokkaichi (JP); Kento Asaoka, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 133 days.

(21) Appl. No.: 16/085,867

(22) PCT Filed: Mar. 18, 2016

(86) PCT No.: PCT/JP2016/058666
§ 371 (c)(1),
(2) Date: Sep. 17, 2018

(87) PCT Pub. No.: WO2017/158813
PCT Pub. Date: Sep. 21, 2017

(65) Prior Publication Data
US 2019/0091785 A1  Mar. 28, 2019

(51) Int. Cl.
*B23K 3/00* (2006.01)
*B23K 3/06* (2006.01)
(Continued)

(52) U.S. Cl.
CPC .............. *B23K 3/06* (2013.01); *B05C 5/00* (2013.01); *B05C 11/10* (2013.01); *B05C 11/101* (2013.01);
(Continued)

(58) Field of Classification Search
CPC .. B23K 3/06–0692; B23K 2101/36–42; B23K 1/00–206; G01F 22/02;
(Continued)

(56) References Cited

U.S. PATENT DOCUMENTS 5,361,963 A * 11/1994 Ozawa ................. B23K 3/0607
118/256
5,918,648 A *  7/1999 Carr ................... H01L 21/67126
118/712
(Continued)

FOREIGN PATENT DOCUMENTS

WO    WO2015/132965 A1    9/2015

OTHER PUBLICATIONS

International Search Report dated Jun. 14, 2016, in PCT/JP2016/058666 filed Mar. 18, 2016.

*Primary Examiner* — Kiley S Stoner
(74) *Attorney, Agent, or Firm* — Oblon, McClelland, Maier & Neustadt, L.L.P.

(57) ABSTRACT

In solder printer, solder supply device uses positive and negative pressure supply device to apply pressure inside air chamber to move solder cup inside outer tube, such that solder paste is supplied from supply nozzle. Controller, when supply of solder paste from supply nozzle is stopped, performs drive control of positive and negative pressure supply device to decrease the pressure inside air chamber, and uses timer to measure the time required from the starting of decreasing the pressure inside the air chamber to when the pressure inside air chamber has reached a set pressure. Because this required time corresponds to the movement amount of solder cup from the start of supply of the solder paste to when supply is stopped, controller using the measured required to estimate the remaining amount of the solder paste in detail with good accuracy.

5 Claims, 6 Drawing Sheets

(51) Int. Cl.
  *H05K 3/12* (2006.01)
  *B05C 5/00* (2006.01)
  *B05C 11/10* (2006.01)
  *G01F 22/02* (2006.01)
  B05C 11/02 (2006.01)
  H05K 3/34 (2006.01)
  B05C 3/18 (2006.01)
  B23K 101/42 (2006.01)

(52) U.S. Cl.
  CPC ............ *B23K 3/0638* (2013.01); *G01F 22/02* (2013.01); *H05K 3/1233* (2013.01); *B05C 3/18* (2013.01); *B05C 11/028* (2013.01); *B23K 2101/42* (2018.08); *H05K 3/1225* (2013.01); *H05K 3/3484* (2013.01); *H05K 2203/0126* (2013.01); *H05K 2203/0139* (2013.01); *H05K 2203/163* (2013.01)

(58) Field of Classification Search
  CPC ......... B05C 11/10; B05C 11/101; B05C 5/00; B05C 3/18; B05C 11/028; H05K 3/1233; H05K 3/3484; H05K 2203/163; H05K 2203/0139; H05K 2203/0126; H05K 3/1225
  USPC ................ 228/102–103, 8–12, 248.1–248.5, 228/256–262, 33–43
  See application file for complete search history.

(56) References Cited

U.S. PATENT DOCUMENTS

| | | | |
|---|---|---|---|
| 6,036,296 A * | 3/2000 | Axtell | B41J 2/17513 347/7 |
| 6,453,810 B1 * | 9/2002 | Rossmeisl | B23K 3/0607 101/123 |
| 6,619,198 B2 * | 9/2003 | Rossmeisl | B23K 3/0607 101/129 |
| 6,761,926 B1 * | 7/2004 | Ha | B41F 15/42 427/282 |
| 7,955,797 B2 * | 6/2011 | McManus | G01F 23/0076 422/62 |
| 9,016,197 B2 * | 4/2015 | Kobayashi | B41F 15/0881 101/123 |
| 9,878,391 B2 | 1/2018 | Senga et al. | |
| 2002/0084305 A1 * | 7/2002 | Pedigo | H05K 3/1233 228/22 |
| 2003/0097941 A1 * | 5/2003 | Rossmeisl | B23K 3/0607 101/129 |
| 2009/0011143 A1 * | 1/2009 | Yatsunami | H05K 3/02 427/555 |
| 2009/0026146 A1 * | 1/2009 | Carlisle | A61M 5/1483 210/741 |
| 2009/0120357 A1 * | 5/2009 | Ikushima | B05C 5/02 118/300 |
| 2009/0325116 A1 * | 12/2009 | Matsuura | B23K 1/0016 432/198 |
| 2010/0229726 A1 * | 9/2010 | Nishimura | B05D 1/26 118/52 |
| 2010/0286932 A1 * | 11/2010 | Caldwell | G01F 22/02 702/55 |
| 2011/0033956 A1 * | 2/2011 | Sakai | C23C 16/4485 438/5 |
| 2016/0297021 A1 * | 10/2016 | Senga | B41F 15/40 |
| 2016/0303675 A1 * | 10/2016 | Fujita | H05K 3/3484 |
| 2017/0014931 A1 * | 1/2017 | Hirukawa | B05C 5/00 |
| 2017/0050427 A1 * | 2/2017 | Mizukoshi | H05K 3/1233 |
| 2017/0203377 A1 * | 7/2017 | Yokoyama | B23K 1/008 |

\* cited by examiner

VISCOUS FLUID SUPPLY DEVICE

TECHNICAL FIELD

The present application relates to a viscous fluid supply device that, by increasing pressure in an air chamber to move a movable member inside a housing, supplies viscous fluid filled between the housing and the movable member from an ejection nozzle.

BACKGROUND ART

Conventionally, a viscous fluid supply device, for example, has a housing and a movable member movably arranged inside the housing, and is configured to, by increasing pressure in an air chamber using a pressure adjusting device, supply the viscous fluid filled between the housing and the movable member from an ejection nozzle.

Further, the viscous fluid supplied by the viscous fluid supply device is depleted every time various work is performed with respect to a circuit board (for example, work of forming solder deposits or the like on the surface of the circuit board, and work of mounting electronic components on the circuit board). Therefore, when using such a viscous fluid supply device, it is necessary to perform work to refill the viscous fluid supply device with viscous fluid, and to improve the work efficiency of performing work with respect to the circuit board, it is necessary to know the remaining amount of viscous fluid in the viscous fluid supply device.

As an example of a viscous fluid supply device that takes account of this, for example, the device disclosed in patent literature 1 is known. The solder supply device disclosed in patent literature 1 includes a solder cup that stores viscous solder, and a supply nozzle that enters inside the solder cup; by supplying air to the space formed between the solder cup and an outer tube, the solder cup is moved, thereby supplying the solder in the solder cup.

Further, the solder supply device disclosed in patent literature 1 includes a first photoelectric sensor for detecting a position of a solder cup that is empty of solder paste being used as a viscous fluid inside the solder cup, and a second photoelectric sensor for detecting a position of a solder cup that has a specified remaining amount of solder paste. The first photoelectric sensor and the second photoelectric sensor are configured to detect the presence of a target item by receiving light that is reflected by a target object (solder cup), the light being laser light emitted in a specified direction. The solder supply device recognizes the remaining amount of solder paste by detecting the movement distance of the solder cup based on the detection results of the first photoelectric sensor and the second photoelectric sensor, and reports the amount by displaying it on a panel or the like.

CITATION LIST

Patent Literature

Patent literature 1: WO2015-132965

BRIEF SUMMARY

Technical Problem

However, with the configuration disclosed in patent literature 1, the first photoelectric sensor and the second photoelectric sensor emit light in a specified direction, and receive laser light reflected by the solder cup so as to detect the presence of the solder cup, therefore it is possible that the color or material of the solder cup will have an influence and cause interference or diffused reflection of the sensor light axis. Because the decrease in the detection accuracy of the first photoelectric sensor and the second photoelectric sensor decreases the accuracy of the information related to the remaining amount of solder paste, this may lead to not improving the work efficiency of work related to a circuit board.

Also, with the configuration of patent literature 1, based on using detection results of the first photoelectric sensor and the second photoelectronic sensor, it is only possible to detect two states: "a state in which the remaining amount of solder paste in the solder cup is zero", and "a state in which the remaining amount of solder paste in the solder cup is a specified amount"; thus, it is difficult to improve the efficiency of work related to a circuit board using detailed information related to the remaining amount of solder paste. Further, with the configuration of patent literature 1, to obtain detailed information regarding the remaining amount of solder paste a large quantity of photoelectric sensors would need to be arranged along the movement direction of the solder cup. Doing this would require lots of space for arranging the sensors and would increase the manufacturing costs of the solder supply device.

The present disclosure takes account of the above problems and an object thereof is to provide a viscous fluid supply device that, by increasing pressure in an air chamber to move a movable member inside a housing, supplies viscous fluid filled between the housing and the movable member from an ejection nozzle, and detects in detail the remaining amount of viscous fluid or the like thus contributing to improved work efficiency.

Solution to Problem

A viscous fluid supply device according to technology disclosed herein that solves the above problems includes: a housing; a movable member arranged inside the housing in a state maintaining airtightness and so as to be movable in accordance with a pressure level inside an air chamber; an ejection nozzle configured to eject a viscous fluid filled between the housing and the movable member in accordance with movement of the movable member inside the housing; a pressure adjusting device configured to apply pressure to the air chamber so as to move the movable member inside the housing, the viscous fluid being supplied from the ejection nozzle by pressure being applied to the air chamber by the pressure adjusting device; a control device configured to control operation related to supply of the viscous fluid via the ejection nozzle; and a pressure sensor configured to detect whether the pressure inside the air chamber has reached a specified set pressure, wherein the control device includes a pressure adjusting control section configured to control operation of the pressure adjusting device so as to decrease the pressure inside the air chamber when supply of the viscous fluid from the ejection nozzle has been stopped, a time measuring control section configured to measure a required time from starting to decrease the pressure inside the air pressure using the pressure adjusting device to when the pressure sensor detects that the pressure inside the air chamber has been reduced to the set pressure, and a remaining amount estimating control section configured to estimate a remaining amount of the viscous fluid based on a measurement result of the required time measured by the time measuring control section.

According to technology disclosed herein, it is possible to move the movable member inside the housing and supply viscous fluid from the ejection nozzle by applying pressure inside the air chamber using the pressure adjusting device. Also, when supply of the viscous fluid from the ejection is stopped, operation of the pressure adjusting device is controlled such that the pressure adjusting device reduces the pressure inside the air chamber, and the time measuring control section measures the required time from when the pressure adjusting device starts reducing the pressure inside the air chamber to when the pressure sensor detects that the pressure inside the air chamber has been reduced to the set pressure. This required time corresponds to the movement amount of the movable member the amount by which the capacity of the space has changed in accordance with the movement of the movable member) from the start of supply of the viscous fluid to when supply is stopped, therefore it is possible to estimate the remaining amount of the viscous fluid in detail with good accuracy. Further, using the remaining amount of the viscous fluid obtained in this manner, it is possible to improve usability related to supply of the viscous fluid, thereby contributing to improved work efficiency.

DESCRIPTION OF EMBODIMENTS

Figure 1:
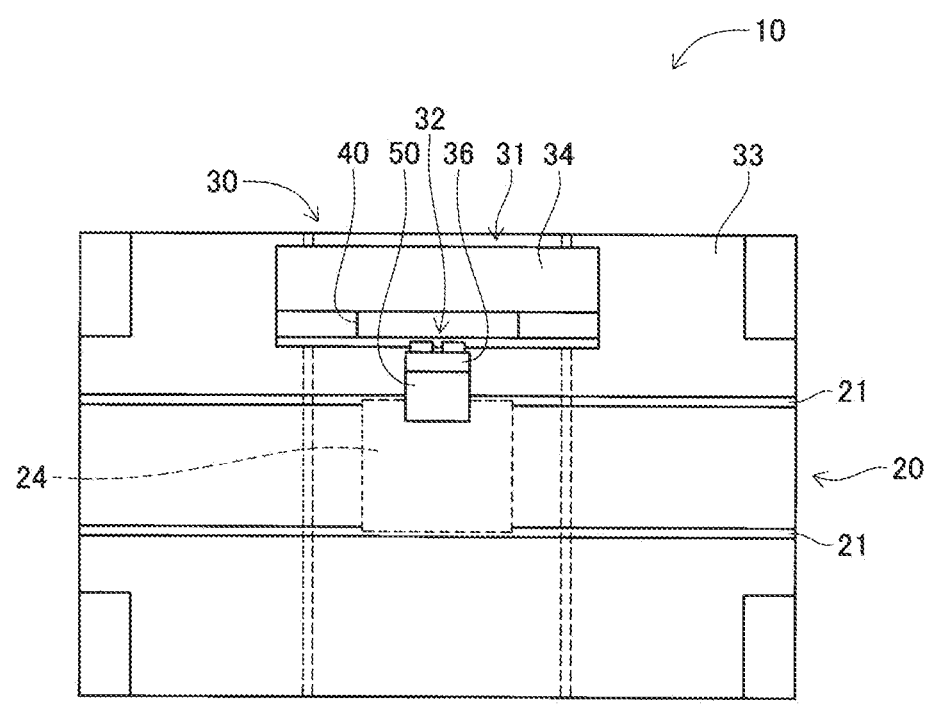
FIG. 1 is a plan view showing a solder printer of an embodiment of the disclosure.

Hereinafter, an embodiment of the present disclosure is described with reference to the figures in the form of solder printer 10. FIG. 1 is a plan view showing solder printer 10 that is an embodiment of the disclosure.
Solder Printer Configuration An embodiment of the disclosure, solder printer 10, includes conveyance device 20, moving device 30, squeegee device 40, solder supply device 50, and display device 90, and supplies solder paste from solder supply device 50 onto the top surface of a metal stencil loaded on circuit board 24 and spreads the solder paste using squeegee device 40 so as to print solder deposits onto circuit board 24 according to the pattern of the holes formed in the metal stencil.

Conveyance device 20 has a pair of conveyor belts 21 that extend in the X-axis direction, electromagnetic motor 22 (refer to FIG. 5) that moves conveyor belts 21, and board holding device 23 (refer to FIG. 5), The pair of conveyor belts 21 are configured to support circuit board 24 and circuit board 24 is conveyed in the X-axis direction by the driving of electromagnetic motor 22. Further, board holding device 23 fixedly holds circuit board 24 supported by conveyor belts 21 in a specified position (the position at which circuit board 24 is shown in FIG. 1). Note that, a metal stencil (not shown) is loaded on the upper surface of circuit board 24, and holes are formed in the metal stencil in a pattern according to the pads or the like of circuit board 24.

Moving device 30 is configured from Y-axis direction slide mechanism 31 and X-axis direction slide mechanism 32. Y-axis direction slide mechanism 31 includes Y-axis slider 34 and Y-axis slider 34 is arranged on base 33 to be slidable in the Y-axis direction. Y-axis slider 34 is moved to a given position in the Y-axis direction by the driving of electromagnetic motor 35 (refer to FIG. 5). X-axis direction slide mechanism 32 includes X-axis slider 36 and X-axis slider 36 is arranged on a side surface of Y-axis slider 34 to be slidable in the X-axis direction. X-axis slider 36 is moved to a given position in the X-axis direction by the driving of electromagnetic motor 37 (refer to FIG. 5).

Squeegee device 40 is attached to Y-axis slider 34 above conveyance device 20, and moves to any position above circuit board 24 that is held by conveyance device 20. Squeegee device 40 has a squeegee (not shown) and the squeegee is held extending downwards by squeegee device 40 to be movable in the Y-axis direction and the up-down direction. With squeegee device 40, the squeegee is moved in the Y-axis direction by the driving of electromagnetic motor 41 (refer to FIG. 5), and is moved up and down by the driving of electromagnetic motor 42 (refer to FIG. 5).

Figure 2:
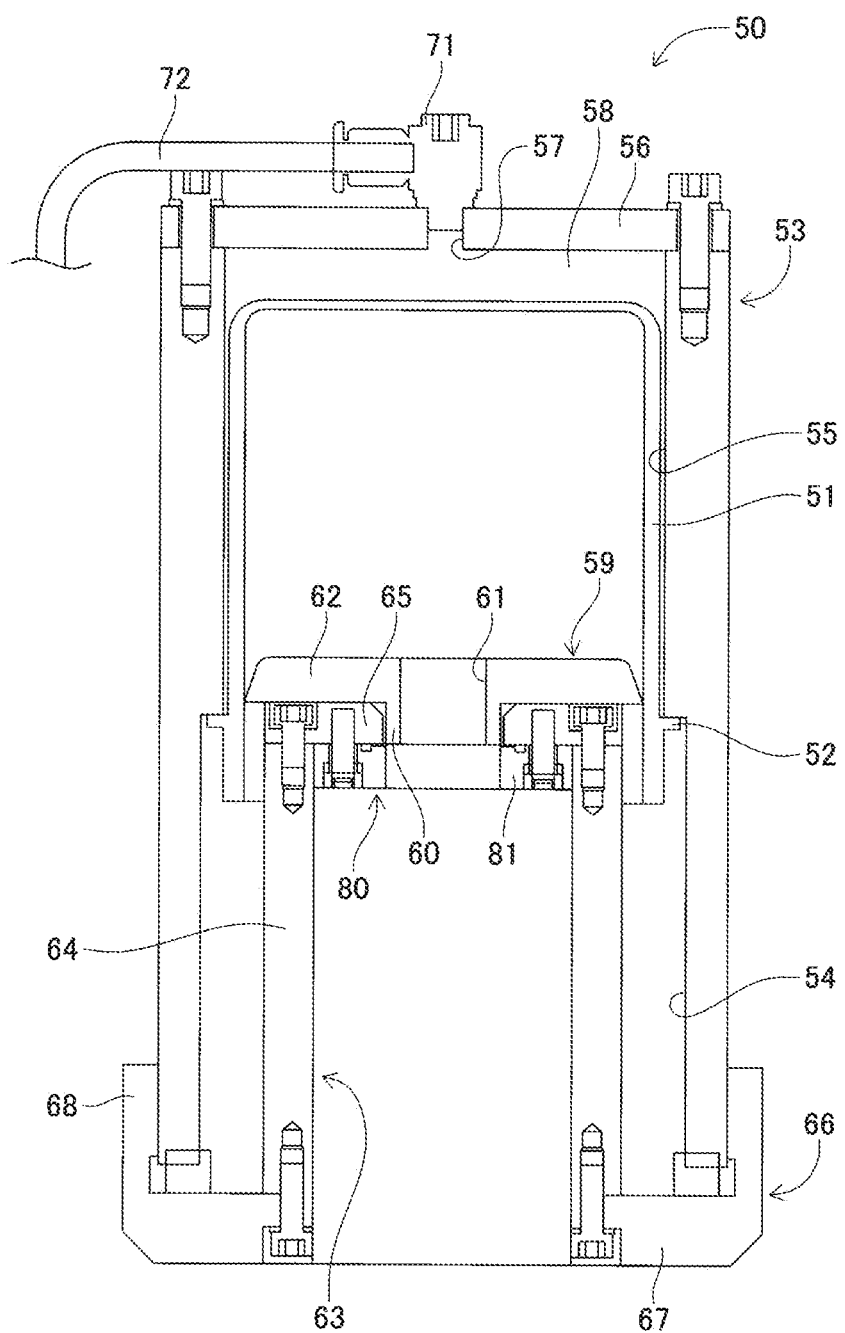
FIG. 2 is a cross section showing a solder supply device of the solder printer.

Solder supply device 50 is for supplying solder paste onto the metal stencil loaded on circuit board 24 and is detachably mounted on X-axis slider 36. Accordingly, solder supply device 50, via drive control of moving device 30, supplies solder paste to given positions on circuit board 24 held by conveyance device 20. The detailed configuration of solder supply device 50 according to this embodiment is described below with reference to the figures. Further, display device 90 includes a liquid crystal display or the like and is configured to display various information regarding solder printer 10.
Detailed Configuration of Solder Supply Device The detailed configuration of solder supply device 50 according to this embodiment is described below with reference to the figures. FIG. 2 is a cross section showing solder supply device 50 of solder printer 10 according to the embodiment.

As shown in FIG. 2, solder supply device 50 is for supplying solder paste onto a metal stencil loaded on circuit board 24, and includes solder cup 51, outer tube 53, supply nozzle 59, inner tube 63, fixed lid 66, and solder cutting device 80. Solder supply device 50 is detachably mounted on X-axis slider 36 and is moved to any position above base 54 by moving device 30.

Solder cup 51 configures a portion of solder supply device 50 and corresponds to the movable member of the present disclosure. Solder cup 51 is a bottomed cylindrical container with an opening at one end and is filled with solder paste. Flange section 52 is formed on the outer circumferential surface at the opening side of solder cup 51; a screw thread (not shown) is formed between flange 52 and the edge of the opening side.

Note that, solder cup 51 is sold commercially with a lid (not shown) that engages with the screw thread covering the opening. That is, solder paste manufacturers sell solder cups 51 after filling solder cups 51 with solder paste and covering the opening with a lid. A customer who buys a solder cup 51 opens the lid and attaches the solder cup 51 with the lid removed to solder supply device 50 to be used.

Outer tube 53 configures a portion of solder supply device 50 and corresponds to a portion of the housing of the present disclosure. Outer tube 53 is a bottomed cylinder with an opening at one end and solder cup 51 is stored inside outer tube 53 in a movable manner. To describe in detail, the inner circumferential surface of outer tube 53 is configured from first inner circumferential surface 54 that is positioned at the opening side of outer tube 53, and second inner circumferential surface 55 that is positioned at bottom surface 56 of outer tube 53. The inside diameter of first inner circumferential surface 54 is slightly larger than the outer diameter of flange section 52 of solder cup 51. On the other hand, the inside diameter of second inner circumferential surface 55 is slightly larger than the cylindrical portion of solder cup 51. As shown in FIG. 2, when the end of the bottom side of solder cup 51 is engaged from the opening of outer tube 53 such that solder cup 51 is stored in outer tube 53, solder cup 51 is arranged to be slidable in a specified direction along an inside section of outer tube 53.

However, the depth dimension of a portion of second inner circumferential surface 55 of outer tube 53 is longer than the length dimension from flange section 52 of solder cup 51 to the bottom surface, and flange section 52 of solder cup 51 stored in outer tube 53 contacts the step surface between first inner circumferential surface 54 and second inner circumferential surface 55 of outer tube 53. Therefore, air chamber 58 is formed between the bottom surface of solder cup 51 and bottom surface 56 of outer tube 53.

Note that, herein, the bottom surface refers to the surface on the opposite side to the opening of a bottomed cylindrical member (that is, solder cup 51 and outer tube 53). In other words, even if the surface on the opposite side to the opening of a bottomed cylindrical member is positioned towards the top, and the opening is positioned towards the bottom, the surface on the opposite side to the opening is referred to as the bottom surface, not the lid.

As shown in FIG. 2, through-hole 57 is formed in bottom surface 56 of outer tube 53, and air adapter 71 is attached in through-hole 57. Air adapter 71 is connected to an end of air tube 72, and the other end of air tube 72 is connected to positive and negative pressure supply device 70 (refer to FIG. 5) via pressure sensor 73 (refer to FIG. 5), which is described later. Positive and negative pressure supply device 70 is configured to supply air or to suck air via air tube 72. Accordingly, solder supply device 50 applies pressure to air chamber 58 inside outer tube 53 by supplying air via drive control of positive and negative pressure supply device 70. Also, solder supply device 50 reduces pressure in air chamber 58 of outer tube 53 by sucking air via drive control of positive and negative pressure supply device 70.

Supply nozzle 59 includes nozzle section 60 and flange section 62 and is engaged inside solder cup 51. With supply nozzle 59, nozzle section 60 and flange section 62 are formed as one body from material that is elastically deformable. Nozzle section 60 is substantially cylindrical with nozzle hole 61 formed running through the inside. Flange section 62 extends in a disk shape from the outer circumferential surface of an end of nozzle section 60. The outer diameter of flange section 62 is slightly larger than the inner diameter of solder cup 51.

Flange section 62, when engaged inside solder cup 51 such that nozzle section 60 is facing the opening side of solder cup 51, substantially creates an airtight seal at the opening of solder cup 51 in a state with the outer circumferential section of flange section 62 elastically deformed. In that state, when supply nozzle 59 is slid inside solder cup 51, solder paste inside solder cup 51 is ejected to the outside via nozzle hole 61 of nozzle section 60. Note that, supply nozzle 59 corresponds to the ejection nozzle of the present disclosure.

As shown in FIG. 2, inner tube 63 includes cylindrical tube section 64 and ring section 65 that covers the edge of tube section 64, and inner tube 63 configures a portion of the housing of the present disclosure. Tube section 64 is formed as a cylinder with an outer diameter slightly smaller than the inner diameter of the opening of solder cup 51, and is arranged inside outer tube 53. Ring section 65 is arranged to cover the edge (end on the bottom surface 56 side of outer tube 53) of tube section 64 and holds supply nozzle 59. To describe in detail, the inner diameter of ring section 65 on tube section 64 is formed to be slightly smaller than the outer diameter of nozzle section 60 of supply nozzle 59 and nozzle section 60 of supply nozzle 59 is pressed inside the inner diameter of ring section 65. By this, inner tube 63 holds supply nozzle 59 using ring section 65.

Note that, the length dimension of nozzle section 60 of supply nozzle 59 is the same as the thickness dimension of ring section 65 of inner tube 63. Accordingly, the lower end surface of nozzle section 60 inserted into the inner diameter section of ring section 65 is at the same height as the lower end surface ring section 65.

Further, fixed lid 66 includes ring section 67 and upright section 66, and is arranged on the end section on the opening side of outer tube 53. Ring section 67 seals between outer tube 53 and inner tube 63 at the open end of outer tube 53. The inner diameter of ring section 67 is substantially the same as the inner diameter of tube section 64 of inner tube 63, and the end section of tube section 64 that extends from solder cup 51 is fixed to the inside edge of ring section 67. Accordingly, fixed lid 66 corresponds to a portion of the housing of the present disclosure.

Upright section 68 is formed extending from the edge along the entire circumference of ring section 67, and a screw thread (not shown) is formed on the inner circumferential surface of upright section 68. Fixed lid 66 is detachably mounted on the opening side of outer tube 53 by the thread (not shown) formed on the opening end of outer tube 53 being engaged with the thread of upright section 68.

Note that, with solder supply device 50, pressure sensor 73 is arranged on the air supply path between air chamber 58 and positive and negative pressure supply device 70, and is connected to each of air chamber 58 and positive and negative pressure supply device 70 via air tube 72. Pressure sensor 73 monitors the pressure inside air chamber 58 formed between solder cup 51 and outer tube 53, and is configured to detect when the pressure inside air chamber 58 has reached a specified set pressure (for example, atmospheric pressure).

Detailed Configuration of Solder Cutting Device

Figure 3:
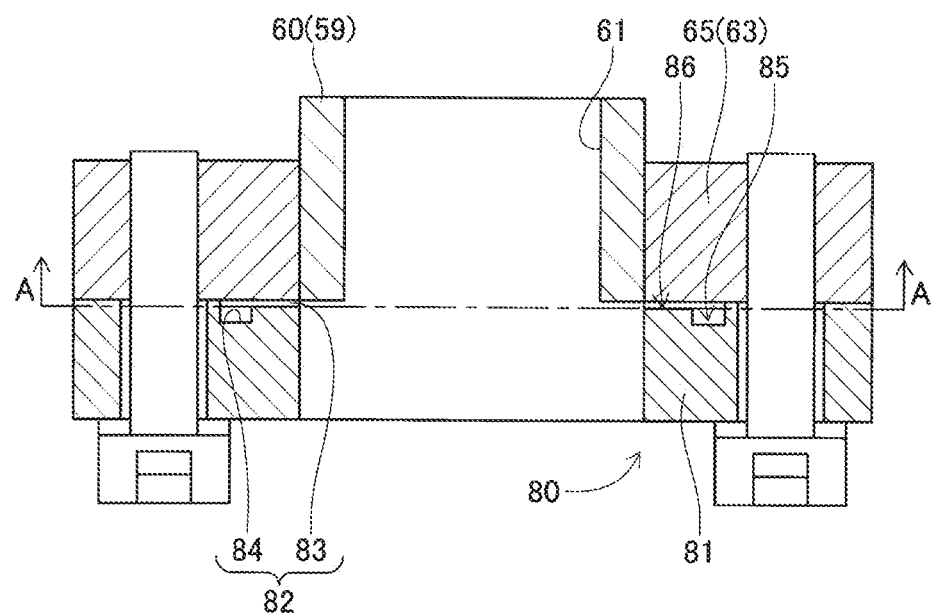
FIG. 3 is an enlarged cross section of a solder cutting device of the solder supply device.

The detailed configuration of solder cutting device 80 of solder supply device 50 is described below with reference to the figures. FIG. 3 is an enlarged view of air groove forming plate 81 fixed to ring section 65 of tube section 64, and FIG. 4 is a cross section along the line A-A of FIG. 3.

Solder cutting device 80, after solder paste has been supplied by solder supply device 50, is for cutting solder paste that hangs from the end section of nozzle section 60 of supply nozzle 59 using compressed air, and includes ring-shaped air groove forming plate 81 and compressed air supply device 87.

Air groove forming plate 81 is ring-shaped and the outer diameter of air groove forming plate 81 is slightly smaller than the inner diameter of tube section 64 of inner tube 63. Accordingly, air groove forming plate 81 can be inserted inside tube section 64 of inner tube 63 and fixed to a lower surface of ring section 65 of inner tube 63. Further, the inner diameter of air groove forming plate 81 is formed with substantially the same dimension of the inner diameter of ring section 65 of inner tube 63.

Figure 4:
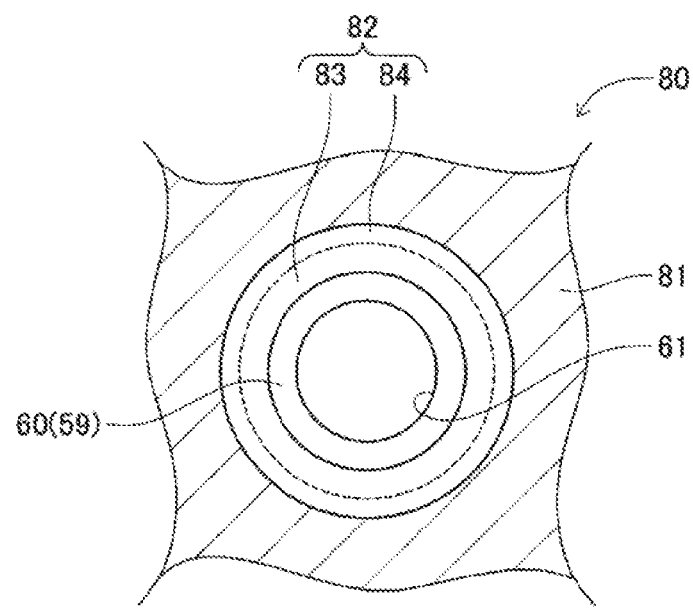
FIG. 4 is a cross section along the line A-A of FIG. 3.

As shown in FIGS. 3 and 4, air groove 82 is formed on the upper surface of air groove forming plate 81 along the entire circumference of the inner edge. Air groove 82 is configured from first groove section 83 positioned on the inner edge side of air groove forming plate 81 and second groove section 84 positioned on the outside of first groove section 83. Second groove section 84 is deeper than first groove section 83.

As described above, with air groove forming plate 81, chamber 85 is configured by the lower surface of ring section 65 and second groove section 84 of air groove 82 such that the upper surface of air groove forming plate 81 is fixed flush with respect to the lower surface of ring section 65 of inner tube 63. Similarly, air passage 86 is configured by the lower surface of ring section 65 and first groove section 83 of air groove 82. As shown in FIGS. 3 and 4, the end section of air passage 86 on the inside is open at the inner circumferential surface of air groove forming plate 81 along the entire circumferential surface, and the end section of air passage 86 on the outside is open to chamber 85.

Further, compressed air supply device 87 is connected to chamber 85 and is configured to supply compressed air. Accordingly, when compressed air is supplied to chamber 85 from compressed air supply device 87, compressed air flows into air passage 86 via chamber 85, and is ejected towards the inside from the inside end section of air passage 86 (that is, an opening to the inner circumferential surface of air groove forming plate 81). As shown in FIG. 3, because the inside end section of air passage 86 is adjacent to the end section of nozzle section 60 of supply nozzle 59, solder paste hanging from nozzle section 60 can be cut by the compressed air being ejected from air passage 86.

Control Items of Solder Printer

Figure 5:
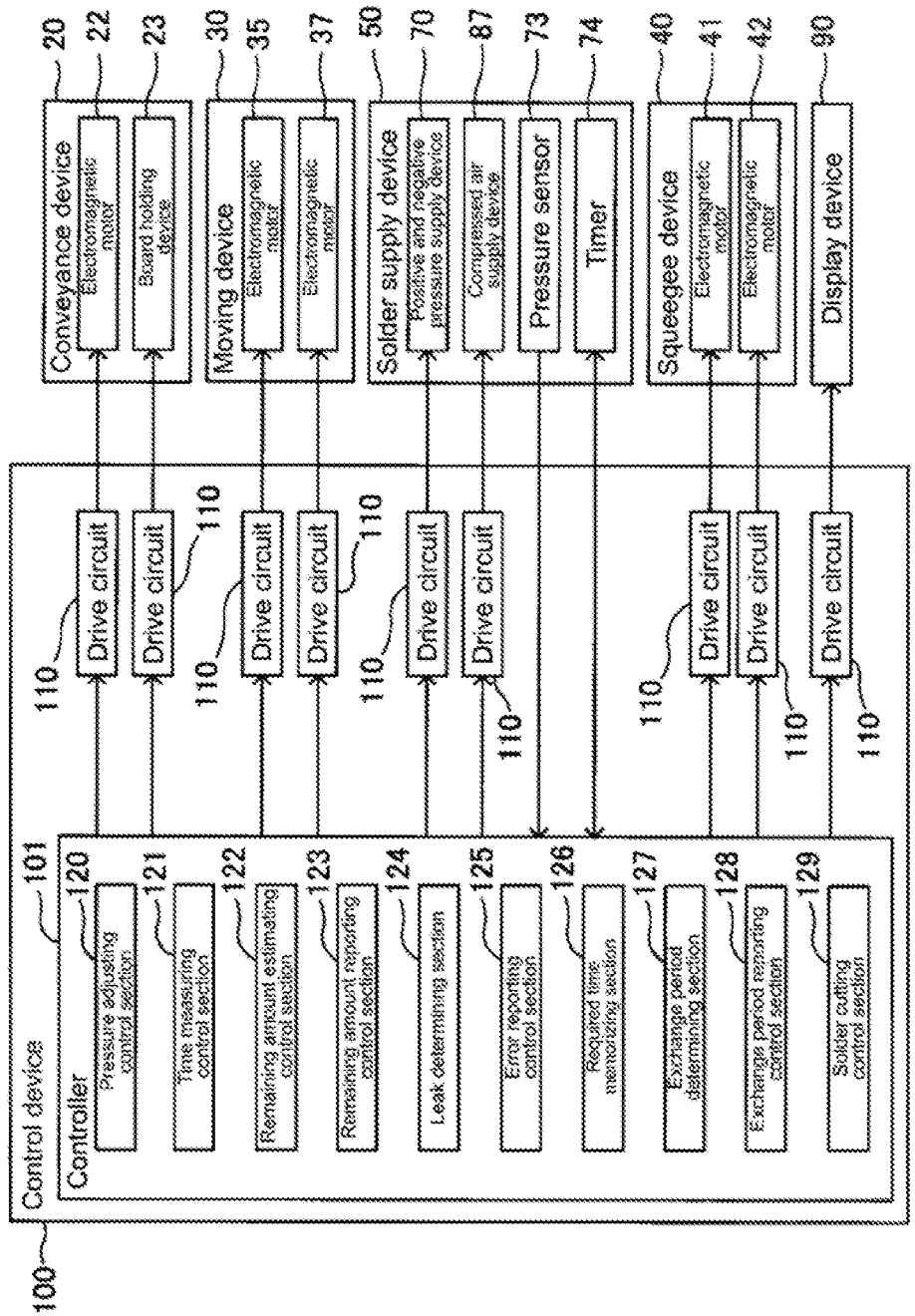
FIG. 5 is a block diagram showing a control device of the solder printer.

Control items of solder printer 10 according to the present embodiment are described next with reference to FIG. 5. FIG. 5 is a block diagram showing control device 100 provided in solder printer 10. As shown in FIG. 5, solder printer 10 of the present embodiment is provided with control device 100.

Control device 100 is provided with controller 101 and multiple drive circuits 110. Controller 101 is configured around a computer and is provided with a CPU, ROM, RAM, and the like. Controller 101 performs various control related to solder printer 10 by executing a control program such as a solder paste supply processing program (refer to FIG. 5) stored on the ROM. Also, controller 101 is connected to each of multiple drive circuits 110.

The multiple drive circuits 110 are connected to electromagnetic motor 22, board holding device 23, electromagnetic motor 35, electromagnetic motor 37, electromagnetic motor 41, electromagnetic motor 42, positive and negative pressure supply device 70, compressed air supply device 87, and display device 90. Thus, the operation of conveyance device 20, moving device 30, squeegee device 40, solder supply device 50, and display device 90 is controlled by controller 101.

Also, controller 101 is connected to pressure sensor 73 and timer 74 that configure part of solder supply device 50. Accordingly, controller 101 receives a detection signal from pressure sensor 73 and determines whether the pressure inside air chamber 58 has reached the set pressure. Also, controller 101 is able to control when timing by timer 74 starts and stops, such that various control related to solder paste supply can be performed using the timing results of timer 74.

As shown in FIG. 5, controller 101 of control device 100 includes as functional sections: pressure adjusting control section 120, time measuring control section 121, remaining amount estimating control section 122, remaining amount reporting control section 123, leak determining section 124, error reporting control section 125, required time memorizing section 126, exchange period determining section 127, exchange period reporting control section 128, and solder cutting control section 129. Pressure adjusting control section 120 to solder cutting control section 129 each operate as functional sections by respective processing being performed when controller 101 performs the solder paste supply processing program (refer to FIG. 6), which is described later. Each functional section and related processing is described later.

Printing Operation of Solder Paste onto Circuit Board

Continuing, operation of solder printer 10 when printing solder paste onto pads or the like of circuit board 24 is described. Specifically, first, based on commands issued from controller 101 to conveyance device 20, circuit board 24 is conveyed to a work position, and fixedly held at that position by board holding device 23. Here, a metal stencil is loaded on the circuit board 24, with holes being formed in the metal stencil to match the pattern of the pads and the like of the circuit board 24.

Then, based on commands issued from controller 101 to moving device 30, solder supply device 50 is moved to a specified position above the circuit board 24 held by board holding device 23. Continuing, based on commands issued from controller 101 to solder supply device 50, solder supply device 50 performs solder paste supply operation. To describe in detail, controller 101 performs drive control of positive and negative pressure supply device 70 via drive circuit 110 such that air is supplied from positive and negative pressure supply device 70 to air chamber 58 inside outer tube 53. By this, because pressure is applied inside air chamber 58, the bottom surface of solder cup 51 is pressed towards supply nozzle 59, solder cup 51 moves downward, and the capacity of air chamber 58 increases.

In accordance with the downward movement of solder cup 51 (that is, the increase in capacity of air chamber 58), solder paste inside solder cup 51 is compressed by flange section 62 of supply nozzle 59 and ejected from nozzle section 60 of supply nozzle 59. Then, the solder paste ejected from nozzle section 60 is supplied onto the upper surface of the metal stencil loaded on the circuit board 24 via the inside of ring section 67 of fixed lid 66.

When a specified amount of solder paste has been supplied onto the circuit board 24, controller 101 performs drive control of positive and negative pressure supply device 70 via drive circuit 110 such that the supply of air to air chamber 58 from positive and negative pressure supply device 70 is stopped. By this, because the solder paste inside solder cup 51 is no longer being compressed, the supply of solder paste from nozzle section 60 is stopped. However, due to the viscosity of the solder paste, some solder paste hangs down from nozzle section 60.

Thus, with solder supply device 50, at appropriate timing after the supply of air to air chamber 58 has been stopped, controller 101 performs drive control of positive and negative pressure supply device 70 so as to supply compressed air to chamber 85. By this, compressed air is ejected towards the inside from the inside end section of air passage 86 (that is, the opening to the inner circumferential surface of air groove forming plate 81). As described above, the opening of air passage 86 at the inner circumferential surface of air passage forming plate 81 is adjacent to the lower end of nozzle section 60, thus solder paste hanging from nozzle section 60 is cut by the compressed air, thereby preventing solder paste from dripping from nozzle section 60.

When supply of solder paste by solder supply device 50 is complete, based on commands issued from controller 101 to moving device 30, squeegee device 40 is moved above the supplied solder paste. Then, based on commands issued from controller 101 to squeegee device 40, squeegee device 40 is moved down and then in the Y-axis direction. By this, solder paste is spread on the upper surface of the metal stencil into the holes formed in the metal stencil. In this manner, solder printer 10 prints solder deposits onto circuit board 24 in accordance with the pattern of the holes formed in the metal stencil.

Contents of Solder Paste Supply Processing Program

The contents of the solder paste supply processing program executed by controller 101 are described next with reference to the flowchart shown in FIG. 6. The solder paste supply processing program of the present embodiment is performed by the CPU of controller 101 when performing supply of solder paste onto circuit board 24 or when presenting various information related to supply of solder paste during a process for forming solder paste deposits on circuit board 24.

In the descriptions below, it is assumed that conveyance of the circuit board 24 to the specified position by conveyance device 20 is complete, that the circuit board 24 is being held by board holding device 23, and that the metal stencil with the holes has been loaded on the circuit board 24. Also, it is assumed that solder supply device 50 has been moved to a position above the circuit board 24 held at the specified position by moving device 30. Further, remaining amount estimation data (for example, refer to FIG. 7) is stored on the RAM of controller 101. Detailed descriptions of the content of the remaining amount estimation data are given later with reference to the figures.

Figure 6:
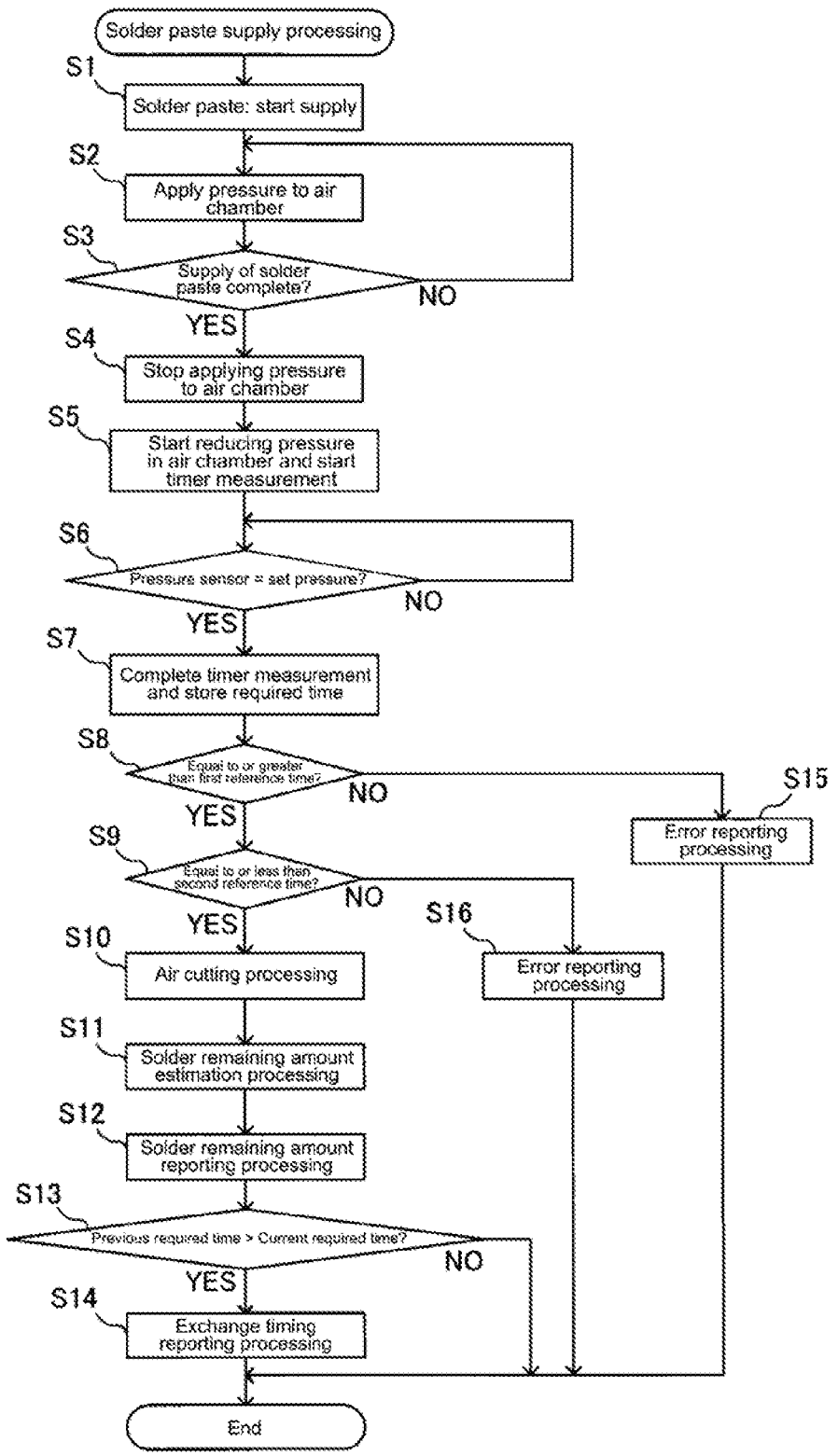
FIG. 6 is a flowchart showing a solder paste supply processing program.

As shown in FIG. 6, in step 1 (hereinafter step is abbreviated to "S"), controller 101, first, outputs a command to "start supplying air to air chamber 58" to positive and negative pressure supply device 70 of solder supply device 50 via drive circuit 110. Based on the command from controller 101, positive and negative pressure supply device 70 starts supplying air to air chamber 58, thereby starting the supplying of solder paste. Then, controller 101 proceeds to processing of S2.

In S2, controller 101 continues to apply pressure to air chamber 58 by performing drive control of positive and negative pressure supply device 70 of solder supply device 50 via drive circuit 110. By this, the bottom surface of solder cup 51 is pressed towards supply nozzle 59, solder cup 51 moves downward, and the capacity of air chamber 58 increases. In accordance with the downward movement of solder cup 51 (that is, the increase in capacity of air chamber 58), solder paste inside solder cup 51 is compressed by flange section 62 of supply nozzle 59 and ejected from nozzle section 60 of supply nozzle 59. Then, controller 101 proceeds to processing of S3.

In S3, controller 101 determines whether supply of solder paste has been completed in accordance with specified supply complete conditions. The supply complete conditions for solder paste may be, for example, a condition that a supply complete operation has been performed by an operation section (not shown), or a movement amount of solder cup 51 inside outer tube 53, a supply amount of air to air chamber 58, an internal pressure of air chamber 58, or the like, may be used as supply complete conditions. If supply of solder paste is complete (S3: yes), controller 101 proceeds to processing of S4. On the other hand, if supply of solder paste is not complete (S3: no), controller 101 returns to the processing of S2 and continues to increase the pressure in air chamber 58. By this, with solder printer 10, supply of solder onto circuit board 24 is continued until the supply complete conditions are satisfied.

In S4, controller 101 outputs a command to "stop supplying air to air chamber 58" to positive and negative pressure supply device 70 of solder supply device 50 via drive circuit 110. Based on the command from controller 101, positive and negative pressure supply device 70 stops supplying air to air chamber 58, thereby stopping the supplying of solder paste. Then, controller 101 proceeds to processing of S5.

In S5, controller 101 outputs a command to "start sucking air from air chamber 58" to positive and negative pressure supply device 70 of solder supply device 50 via drive circuit 110. Based on the command from controller 101, positive and negative pressure supply device 70 starts sucking air from air chamber 58, thereby starting to reduce the pressure inside air chamber 58. By this, because solder cup 51 is drawn back towards air chamber 58, solder paste dripping from nozzle section 60 is drawn back inside nozzle hole 61. At the same time, controller 101 outputs a command to timer 74 to start timing. Then, controller 101 proceeds to processing of S6.

In S6, controller 101 determines whether the pressure inside air chamber 58 has reached a set pressure (for example, atmospheric pressure) based on a detection signal received from pressure sensor 73 of solder supply device 50. If the pressure inside air chamber 58 has reached the set pressure (S6: yes), controller 101 proceeds to processing of S7. On the other hand, if the pressure inside air chamber 58 has not reached the set pressure (S6: no), controller 101 stands by while the pressure inside air chamber 58 continues to be reduced while timer 74 performs timing. Note that, when performing processing of S4 to S6, controller 101 functions as pressure adjusting control section 120.

Proceeding to S7, controller 101 outputs a command to timer 74 to end timing by timer 74 and stores the result of the timing by timer 74 on the RAM of controller 101. The timing result of timer 74 is the time required from the starting of reducing the pressure inside air chamber 58 (S5) to when the pressure inside air chamber 58 has reached the specified pressure (S7). Data representing the measured required time is stored on the RAM, then controller 101 moves on to processing of S8. Note that, when performing the above processing of S5 to S7, controller 101 functions as time measuring control section 121. Further, when performing processing of S7, controller 101 and the RAM of controller 101 function as required time memorizing section 126.

In S8, controller 101 references the RAM of controller 101 and determines whether the required time measured in S7 is equal to or greater than the first reference time. Here, a first reference time refers to at least the time required from the starting of decreasing the pressure inside air chamber 58 (S5) to when the pressure inside air chamber 58 has reached the specified pressure (S7) in a case in which each of the air supply path between configuration member solder supply device 50 and positive and negative pressure device 70 is assembled correctly in solder supply device 50. If the measured required time is equal to or greater than the first reference time (S8: yes), controller 101 proceeds to processing of S9. On the other hand, if the required time is less than the first reference time (S8: no), controller 101 determines that air adapter 71 has been disconnected or that there is an air leak in the air supply path between the detection location of pressure sensor 73 and air adapter 71, then proceeds to processing of S15.

Upon proceeding to S9, controller 101 determines whether the measured required time is equal to or less than a second reference time. Here, a second reference time refers to a time that would be considered long enough not to be equaled to or exceeded by the time required from the starting of decreasing the pressure inside air chamber 58 (S5) to when the pressure inside air chamber 58 has reached the specified pressure (S7) in a case in which each of the aft supply path between configuration member solder supply device 50 and positive and negative pressure device 70 is assembled correctly in solder supply device 50. If the measured required time is equal to or less than the second reference time (S9: yes), controller 101 proceeds to processing of S10. On the other hand, if the required time is longer than the second reference time (S9: no), controller 101 determines that there is an air leak in the air supply path between the detection location of pressure sensor 73 and positive and negative pressure supply device 70, then proceeds to processing of S16. Note that, when performing processing of S8 and S9, controller 101 functions as leak determining section 124.

In S10, controller 101 performs air cutting processing and outputs a command to compressed air supply device 87 of solder cutting device 80 via drive circuit 110 to "supply compressed air to air passage 86". By this, in solder cutting device 80, compressed air is blown from the opening of air passage 86 so as to cut solder paste hanging from nozzle section 60. When proceeding to S10, because the pressure inside air chamber 58 is the set pressure (for example, atmospheric pressure), solder paste hanging from nozzle section 60 does not increase in size. That is, by performing the air cutting processing (S10), it is possible to reliably prevent solder paste from dripping from nozzle section 60. Note that, when performing air cutting processing (S10), controller 101 functions as solder cutting control section 129.

Upon proceeding to S11, controller 101 performs solder remaining amount estimation processing and estimates the remaining amount of solder paste inside solder cup 51 of solder supply device 50. Specifically, controller 101 estimates the remaining amount of solder paste at the current time by referencing data representing the required time measured in S7, and remaining amount estimation data stored in the RAM of controller 101.

Figure 7:
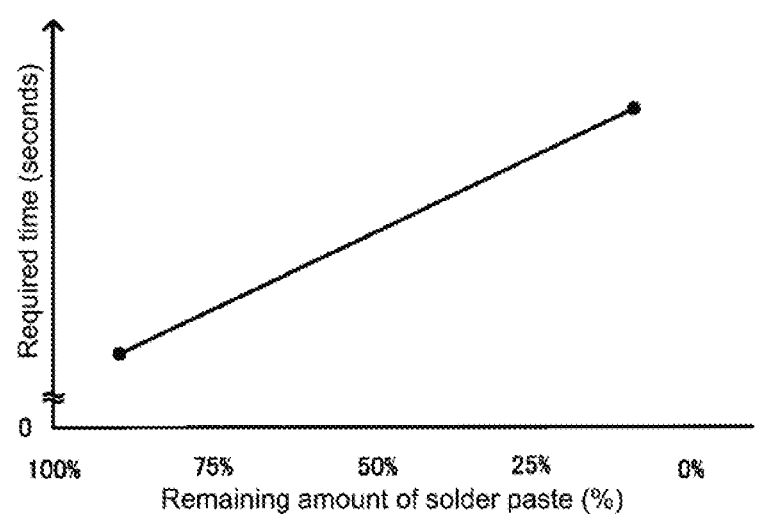
FIG. 7 is a graph showing an example of remaining amount estimation data.

Remaining amount estimation data of the present embodiment represents the relationship between the remaining amount of solder paste and the required time from starting to decrease the pressure inside air chamber 58 described above (S5), to the time the pressure inside air chamber S8 reaches the set pressure (S7). Remaining amount estimation data is configured from multiple actual values of the remaining amount of solder paste and actual values of the required amount corresponding to each of those remaining amounts of solder paste. Further, as shown in FIG. 7, remaining amount estimation data represents a tendency for the required time to become longer the smaller the remaining amount of solder paste in solder cup 51.

As described above, the required time of the present embodiment depends on the capacity of air chamber 58 in solder supply device 50. Further, in solder supply device 50, when the capacity of air chamber 58 formed between outer tube 53 and solder cup 51 is increased, the capacity between solder cup 51 and supply nozzle 59 (that is, the capacity of the portion filled with solder paste) decreases, and solder paste is ejected from nozzle section 60 of supply nozzle 59.

Based on this relationship, it is possible to estimate the position of solder cup 51 (in other words, the capacity of air chamber 58) when supply of solder paste has stopped from a required time value, and it is possible to estimate the remaining amount of solder paste when supply of the solder paste is stopped.

In solder remaining amount estimation processing (S11), controller 101 is able to estimate the remaining amount of solder paste at the current time by applying the current required time measured in S7 with respect to the relationship between the required time and solder paste remaining amount based on the remaining amount estimation data. After estimating the remaining amount of solder paste at the current time, controller 101 proceeds to processing of S12. Note that, when performing processing of S11, controller 101 functions as remaining amount estimating control section 122.

In S12, controller 101 performs solder remaining amount reporting processing and reports the remaining amount of solder paste at the current time estimated during solder remaining amount estimation processing (S11). Specifically, controller 101 displays a message of "remaining amount of solder paste at this point (for example: '75% remaining')" by driving controlling display device 90 via a drive circuit. Then, controller 101 proceeds to processing of S13. Note that, when performing processing of S12, controller 101 functions as remaining amount reporting control section 123.

In S13, controller 101 references RAM of controller 101 and determines whether the current required time is shorter than the previous required time. If the current required time is shorter than the previous required time (S13: yes), controller 101 proceeds to processing of S14. On the other hand, if the current required time is equal to or greater than the previous required time (S13: no), controller 101 ends the solder paste supply processing program.

As described above, supply nozzle 59 of solder supply device 50 is engaged in solder cup 51 so as to largely seal the opening section of solder cup 51 in a state with the outer circumferential section of flange section 62 elastically deformed, and slides inside solder cup 51 in accordance with the movement of solder cup 51 due to the pressure in air chamber 58. Accordingly, when solder paste supply operation is repeated, wear or deformation may occur at the outer circumferential section of flange section 62. If wear or deformation occurs at the outer circumferential edge of flange section 62 of supply nozzle 59, a gap occurs between the inner surface of solder cup 51 and flange section 62, leading to operation problems related to solder paste supply operation such as excess supply of solder paste via the gap. Thus, it is desirable to exchange supply nozzle 59 at suitable timing.

Here, if wear or deformation occurs at the outer circumferential edge of flange section 62 and a gap occurs between the inner surface of solder cup 51 and flange section 62, when solder cup 51 moves in accordance with the decreasing pressure in air chamber 58 (S5 to S7), the friction force on solder cup 51 will be smaller. In this case, solder cup 51 may move at high speed to the bottom surface 56 side of outer tube 53 when the pressure is decreased in air chamber 58 (S5 to S7), such that movement becomes easier the further that wear and the like progresses. During the process of decreasing the pressure in air chamber 58 (S5 to S7), if rapid movement of solder cup 51 occurs, there will be a trend for the required time measured by timer 74 to become relatively short.

With regard to this point, normally there is a trend for the required time to increase as solder paste is supplied and the remaining amount of solder paste decreases (refer to FIG. 7). That is, if the current required time is equal to or greater than the previous required time (S13: no), it can be determined that supply nozzle 59 has a flange section 62 for which the wear and deformation of the outer circumferential edge is within a tolerance range. On the other hand, if the current required time is shorter than the previous required time (S13: yes), it can be taken that rapid movement of solder cup 51 occurred during the process for decreasing the pressure inside air chamber 58 (S5 to S7). Because wear or deformation on the outer circumferential edge of flange section 62 of supply nozzle 59 may be considered to have occurred, it can be determined that it is time to exchange supply nozzle 59 for a new one.

In this manner, determination processing of S13 is for determining whether it time to exchange supply nozzle 59 arranged in solder supply device 50. Note that, when performing processing of S13, controller 101 functions as exchange period determining section 127.

Proceeding to S14, controller 101 performs exchange timing reporting processing and reports that it is time to exchange supply nozzle 59 of solder supply device 50. Specifically, controller 101 displays a message on a display of display device 90 such as "exchange supply nozzle 59 of solder supply device 50" by drive controlling display device 90 via a drive circuit. Then, controller 101 ends the solder paste supply processing program. Note that, when performing processing of S14, controller 101 functions as exchange period reporting control section 128.

In S15 performed if the current required time is less than the first reference time (S8: no), controller 101 performs error reporting processing, and reports the fact that air adapter 71 has been disconnected or that there is an air leak in the air supply path between the detection location of pressure sensor 73 and air adapter 71. This is because the current required time being shorter than the first reference time can be considered to be caused by air adapter 71 being disconnected or because outside air is entering through a portion of the air supply path between the detection location of pressure sensor 73 and air adapter 71 that is connected to the outside. Specifically, controller 101 displays a message on the display of display device 90 of "air leak: check the assembly of items configuring solder supply device 50 and air tube 72 and the like between the detection location of pressure sensor 73 and air adapter 71" by drive controlling display device 90 via a drive circuit. Then, controller 101 ends the solder paste supply processing program.

Further, in S16 performed if the current required time is greater than the second reference time (S9: no), controller 101 performs error reporting processing, and reports the fact that there is an air leak in the air supply path between the detection location of pressure sensor 73 and positive and negative pressure supply device 70. This is because the current required time being longer than the second reference time can be considered to be caused by outside air entering through a portion of the air supply path between the detection location of pressure sensor 73 and positive and negative pressure supply device 70 that is connected to the outside, thereby decreasing the amount of air that passes past the detection location of pressure sensor 73. Specifically, controller 101 displays a message on the display of display device 90 of "air leak: check air tube 72 between the detection location of pressure sensor 73 and positive and negative pressure supply device 70" by drive controlling display device 90 via a drive circuit. Then, controller 101 ends the solder paste supply processing program. Note that, when performing processing of S15 and S16, controller 101 functions as error reporting control section 125.

As described above, according to solder printer 10 of the present embodiment, by using positive and negative pressure supply device 70 to apply pressure inside air chamber 58 of solder supply device 50, solder cup 51 is moved inside outer tube 53, such that solder paste is supplied from supply nozzle 59 (S1 to S4). Controller 101, when supply of solder paste from supply nozzle 59 is stopped, performs drive control of positive and negative pressure supply device 70 to decrease the pressure inside air chamber 58 (S5), and uses timer 74 to measure the time required (S7) from the starting of decreasing the pressure inside the air chamber (S5) to when pressure sensor 73 detects that the pressure inside air chamber 58 has reached a set pressure (S6: yes).

Because this required time corresponds to the movement amount of solder cup 51 (the amount by which the capacity of air chamber 58 has changed in accordance with the movement of solder cup 51) from the start of supply of the solder paste to when supply is stopped, it is possible to estimate the remaining amount of the solder paste in detail with good accuracy (S11). Also, according to solder printer 10, by using the remaining amount of solder paste estimated by solder remaining amount estimation processing (S11), it is possible to perform adjustment or the like of the supply amount of the solder paste or of the exchange period of the solder cup (that is, time for replenishment of solder paste), thus contributing to an improvement in work efficiency related to work of printing solder paste on circuit board 24.

Also, with solder printer 10, controller 101 displays on the display of display device 90 (S12) to report the remaining amount of solder paste at the current time estimated during solder remaining amount estimation processing (S11). Therefore, the user can know the remaining amount of solder paste in solder supply device 50 whenever supply operation of solder paste is performed (S1 to S4) in solder supply device 50.

By this, because it is possible to understand the trend in the remaining amount of solder paste with high accuracy, the user can create a suitable production plan by accurately understanding the periods at which exchange of solder cup 51 is required (that is, replenishment of solder paste). Further, because the remaining amount of solder paste in solder supply device 50 is reported every time supply operation of solder paste is performed (S1 to S4), it is possible to understand the supply amount for every solder paste supply operation. By this, the solder paste supply amount during subsequent supply operations can be adjusted to a suitable amount, and supplying excess solder paste can be curtailed.

With solder printer 10 of the present disclosure, solder supply device 50 supplies solder paste by moving solder cup 51 via supply and removal of air to and from air chamber 58. Accordingly, for supply operation of solder paste, air leaks are an extremely important factor, with the occurrence of air leaks having a large influence on the work efficiency with respect to work of printing solder paste on circuit board 24.

With respect to this point, solder printer 10, by performing determining processing of S8 and S9, determines whether there is an leak at air chamber 58 or in the air supply path (for example, air adapter 71, air tube 72, or the like) for air chamber 58, and by performing error reporting processing (S15, S16), reports the fact that an air leak is occurring to the user by displaying a notification on display device 90. By this, the user knows that an air leak is occurring at air chamber 58 or in the air supply path (for example, air adapter 71, air tube 72, or the like) for air chamber 58, and is able to perform suitable countermeasures such as checking the assembly state of configuration items of solder supply device 50, or the assembly state of air adapter 71 and air tube 72. By performing suitable countermeasures for an air leak, decreases in work efficiency related to work of printing solder paste on circuit board 24 can be curtailed.

Supply nozzle 59 of the present embodiment is inserted into the opening section of solder cup 51 in a state with the outer circumferential section of flange section 62 elastically deformed, and slides inside solder cup 51 with the outer circumferential edge of flange section 62 in contact with the inner surface of solder cup 51. Therefore, by performing supply operation of solder paste, wear and deformation occurs on the outer circumferential edge of flange section 62 of supply nozzle 59.

In a case in which wear or deformation occurs on the outer circumferential edge of flange section 62 of supply nozzle 59 such that a gap occurs between flange section 62 and the inner surface of solder cup 51, as this will affect supply of solder paste, supply nozzle 59 needs to be exchanged. Therefore, in this case, because operation of solder cup 51 due to the increased pressure inside air chamber 58 becomes faster due to the gap between flange section 62 and the inner surface of solder cup 51, by comparing the required time (S13), it is possible for controller 101 to determine whether it is necessary to exchange supply nozzle 59 (whether it is the exchange period). Further, controller 101, by performing exchange timing reporting processing (S14), is able to prompt a user to exchange supply nozzle 59, thereby maintaining solder supply device 50 in a state in which correct supply of solder paste is possible.

Also, with solder printer 10 of the present embodiment, solder supply device 50 includes solder cutting device 80, solder cutting device 80 being configured to cut solder paste hanging from nozzle section 60 of supply nozzle 59 using compressed air. Here, solder printer 10 uses pressure sensor 73 to detect that the pressure inside air chamber 58 has reached a set pressure (for example, atmospheric pressure) (S6: yes), and then performs air cutting processing (S7). Thus, according to solder printer 10, because it is possible to cut solder paste hanging from nozzle section 60 in a state in which solder paste will not further hang from nozzle section 60 of supply nozzle 59, it is possible to reliably prevent dripping of solder paste.

Note that, in the embodiment described above, solder printer 10 and solder supply device 50 are examples of a viscous fluid supply device of the present disclosure, outer tube 53, inner tube 63, and fixed lid 66 are examples of a housing of the present disclosure. Further, solder cup 51 is an example of a movable member of the present disclosure, and supply nozzle 59 is an example of an ejection nozzle of the present disclosure. Positive and negative pressure supply device 70 is an example of a pressure adjusting device of the present disclosure, and pressure sensor 73 is an example of a pressure sensor of the present disclosure. Display device 90 is an example of a reporting device of the present disclosure, and controller 101 is an example of a memory section of the present disclosure. Solder cutting device 80 is an example of a viscous fluid cutting device of the present disclosure, and control device 100 and controller 101 are examples of a control device of the present disclosure. Solder paste is an example of a viscous fluid of the present disclosure.

The present disclosure is not limited to the above-described embodiments and may be improved and modified in various ways without departing from the scope of the disclosure. For example, in an embodiment above, the present disclosure is described with solder paste as a viscous fluid, but the configuration is not limited to this. For example, flux, silver paste, liquid solder, or the like may be used as the viscous fluid.

Also, the viscous fluid supply device of the present disclosure is not limited to the configuration of embodiments described above, and various configurations may be applied so long as the configuration is able to move a movable member inside a housing to supply viscous fluid by adjusting the pressure inside an air chamber.

For example, the present disclosure may be applied to a syringe type viscous fluid supply device. A syringe type viscous fluid supply device is configured substantially as a syringe with a syringe (corresponding to a housing) formed as a cylinder with a bottom and a nozzle at one end, and a plunger (corresponds to movable member) arranged inside the syringe maintaining a sealed state while being movable in accordance with the pressure inside the air chamber. The syringe type viscous fluid supply device supplies viscous fluid filled between the plunger and the inside of the syringe by adjusting the pressure inside the air chamber to move the plunger. Such a configuration can easily be applied to the present disclosure.

Further, in embodiments above, air chamber 58 is formed between solder cup 51 and outer tube 53 of solder supply device 50, but the air chamber of the present disclosure does not have to be inside the housing. The air chamber of the present disclosure may be outside the housing, so long as the movable member is capable of being moved in accordance with the pressure inside the air chamber. For example, the configuration may be such that a portion of the movable member is arranged to be movable while maintaining a seal inside an air chamber 58 formed externally.

REFERENCE SIGNS LIST

10: solder printer;
50: solder supply device;
51: solder cup;
53: outer tube;
58: air chamber;
59: supply nozzle;
63: inner tube;
66: fixed lid;
70: positive and negative pressure supply device;
73: pressure sensor;
90: display device;
100: control device;
101: controller

The invention claimed is:
1. A viscous fluid supply device comprising:
a housing;
a movable member arranged inside the housing in a state maintaining airtightness and so as to be movable in accordance with a pressure level inside an air chamber;
an ejection nozzle configured to eject a viscous fluid filled between the housing and the movable member in accordance with movement of the movable member inside the housing;
a pressure adjusting device configured to apply pressure to the air chamber so as to move the movable member inside the housing, the viscous fluid being supplied from the ejection nozzle by pressure being applied to the air chamber by the pressure adjusting device;
a control device configured to control operation related to supply of the viscous fluid via the ejection nozzle; and
a pressure sensor configured to detect whether the pressure inside the air chamber has reached a specified set pressure;
wherein
the control device includes
a pressure adjusting control section configured to control operation of the pressure adjusting device so as to decrease the pressure inside the air chamber when supply of the viscous fluid from the ejection nozzle has been stopped,
a time measuring control section configured to measure a required time from starting to decrease the pressure inside the air chamber using the pressure adjusting device to when the pressure sensor detects that the pressure inside the air chamber has been reduced to the set pressure, and
a remaining amount estimating control section configured to estimate a remaining amount of the viscous fluid based on a measurement result of the required time measured by the time measuring control section.

2. The viscous fluid supply device according to claim 1, further including
a reporting device configured to report various information,
wherein
the control device includes a remaining amount reporting control section configured to control the reporting device so as to report the remaining amount of the viscous fluid estimated by the remaining amount estimating control section.

3. The viscous fluid supply device according to claim 1, further including
a reporting device configured to report various information,
wherein
the control device includes
a leak determining section configured to determine whether were is an air leak in the air chamber or an air path connected to the air chamber based on a measurement result of the required time measured by the time measuring control section; and
an error reporting control section configured to control the reporting device to report that an error is occurring when the leak determining section has determined that there is an air leak.

4. The viscous fluid supply device according to claim 1 further including
a memory section configured to memorize a measurement result of the required time measured immediately prior by the time measuring control section, and
a reporting section configured to report various information,
wherein
the movable member is formed as a tube sealed at one end that houses the viscous fluid inside the tube,
the ejection nozzle is configured to eject the viscous fluid externally from inside the movable member by being inserted inside the movable member and a relative position inside the movable member being changed in accordance with movement of the movable member due to the increased pressure inside the air chamber, and
the control device includes
an exchange period determining section configured to determine whether it is an exchange period of the ejection nozzle by comparing an immediately previous measurement result of the required time memorized on the memory section and a current measurement result of the required time measured by the time measuring control section, and
an exchange period reporting control section configured to control the reporting device so as to report that the exchange period of the ejection nozzle has been reached in a case in which the exchange period determining section has determined that the exchange period of the ejection nozzle has been reached.

5. The viscous fluid supply device according to claim 1, further including
a viscous fluid cutting device configured to cut the viscous fluid supplied from the ejection nozzle by blowing air,
wherein
the control device includes a viscous fluid cutting control section configured to control the viscous fluid cutting device such that the viscous fluid is cut by blowing air when the pressure sensor detects that the pressure inside the air chamber has reached the set pressure.

* * * * *